United States Patent
Lee et al.

(10) Patent No.: US 8,296,157 B2
(45) Date of Patent: Oct. 23, 2012

(54) APPARATUS AND METHOD FOR DECIDING ADAPTIVE NOISE LEVEL FOR BANDWIDTH EXTENSION

(75) Inventors: Tae-Jin Lee, Daejon (KR);
Seung-Kwon Beack, Seoul (KR);
Min-Je Kim, Daejon (KR); Jeong-Il Seo, Daejon (KR); Dae-Young Jang, Daejon (KR); Kyeong-Ok Kang, Daejon (KR); Jin-Woo Hong, Daejon (KR); Ho-Chong Park, Gyeonggi-do (KR); Young-Cheol Park, Gangwon-do (KR); Rin-Chul Kim, Seoul (KR); Seong-Jun Oh, Gyeonggi-do (KR); Chang-Beom Ahn, Seoul (KR); Dong-Gyu Sim, Seoul (KR)

(73) Assignees: Electronics and Telecommunications Research Institute, Daejeon (KR);
Kwangwoon University Industry-Academic Collaboration Foundation, Seoul (KR)

( * ) Notice: Subject to any disclaimer, the term of this patent is extended or adjusted under 35 U.S.C. 154(b) by 876 days.

(21) Appl. No.: 12/414,768

(22) Filed: Mar. 31, 2009

(65) Prior Publication Data
US 2010/0094638 A1    Apr. 15, 2010

(30) Foreign Application Priority Data

Apr. 30, 2008    (KR) .......................... 10-2008-0040890

(51) Int. Cl.
*G10L 19/00*    (2006.01)
*G10L 11/04*    (2006.01)

(52) U.S. Cl. .......................... 704/500; 704/205; 704/207
(58) Field of Classification Search .................. 704/205, 704/206, 207, 500, 501
See application file for complete search history.

(56) References Cited

U.S. PATENT DOCUMENTS

| | | | |
|---|---|---|---|
| 5,946,650 A * | 8/1999 | Wei | 704/207 |
| 6,507,814 B1 * | 1/2003 | Gao | 704/220 |
| 6,680,972 B1 | 1/2004 | Liljeryd et al. | |
| 2002/0087304 A1 * | 7/2002 | Kjorling et al. | 704/219 |
| 2003/0187663 A1 * | 10/2003 | Truman et al. | 704/500 |
| 2004/0131203 A1 * | 7/2004 | Liljeryd et al. | 381/98 |
| 2006/0036432 A1 * | 2/2006 | Kjorling et al. | 704/206 |

(Continued)

FOREIGN PATENT DOCUMENTS

JP    2002-261553 A    9/2002

(Continued)

OTHER PUBLICATIONS

Dietz et al. "Spectral Band Replication, a novel approach in audio coding", Audio Engineering Society Convention Paper, Presented at the 112th Convention, May 10-13, 2002 Munich, Germany.*

(Continued)

*Primary Examiner* — Jialong He
(74) *Attorney, Agent, or Firm* — Ladas & Parry LLP

(57) ABSTRACT

An apparatus and method for deciding an adaptive noise level for bandwidth extension are provided. The apparatus includes a noise level decider for deciding a high-band noise level for bandwidth extension according to tonality of an input signal, a pitch frequency analyzer for detecting a pitch frequency of the input signal and analyzing correlation between the detected pitch frequency and a frequency channel, and a noise level controller for adaptively controlling the decided high-band noise level based on the analyzed correlation of the pitch frequency and the frequency channel.

13 Claims, 8 Drawing Sheets

U.S. PATENT DOCUMENTS

| | | | |
|---|---|---|---|
| 2007/0038439 A1* | 2/2007 | Schuijers et al. | 704/212 |
| 2009/0110208 A1* | 4/2009 | Choo et al. | 381/71.1 |

FOREIGN PATENT DOCUMENTS

| | | |
|---|---|---|
| KR | 1020030010898 A | 2/2003 |
| KR | 1020060051298 A | 5/2006 |
| WO | 2006/132159 A1 | 12/2006 |

OTHER PUBLICATIONS

Sewon Lee, et al; "Enhancement of SBR for Speech Signal Using Adaptive Noise Floor Level", 2009 Journal of the Acoustical Society of Korea, vol. 28, No. 2, pp. 148-154.

* cited by examiner

APPARATUS AND METHOD FOR DECIDING ADAPTIVE NOISE LEVEL FOR BANDWIDTH EXTENSION

CROSS-REFERENCES TO RELATED APPLICATIONS

The present invention claims priority of Korean Patent Application Nos. 10-2007-0119426 and 10-2008-0040890, filed on Nov. 21, 2007, and Apr. 30, 2008, respectively, which are incorporated herein by reference.

BACKGROUND OF THE INVENTION

1. Field of the Invention

The present invention relates to an apparatus and method for deciding an adaptive noise level for bandwidth extension; and, more particularly, to an apparatus and method for deciding an adaptive noise level for bandwidth extension, which accurately measure a high-band noise level and improve the quality of a high-band signal by adaptively controlling the high-band noise level according to a pitch frequency of an input signal in deciding a high-band noise level to correct the tonality of high-band for bandwidth extension.

2. Description of Related Art

Figure 1:
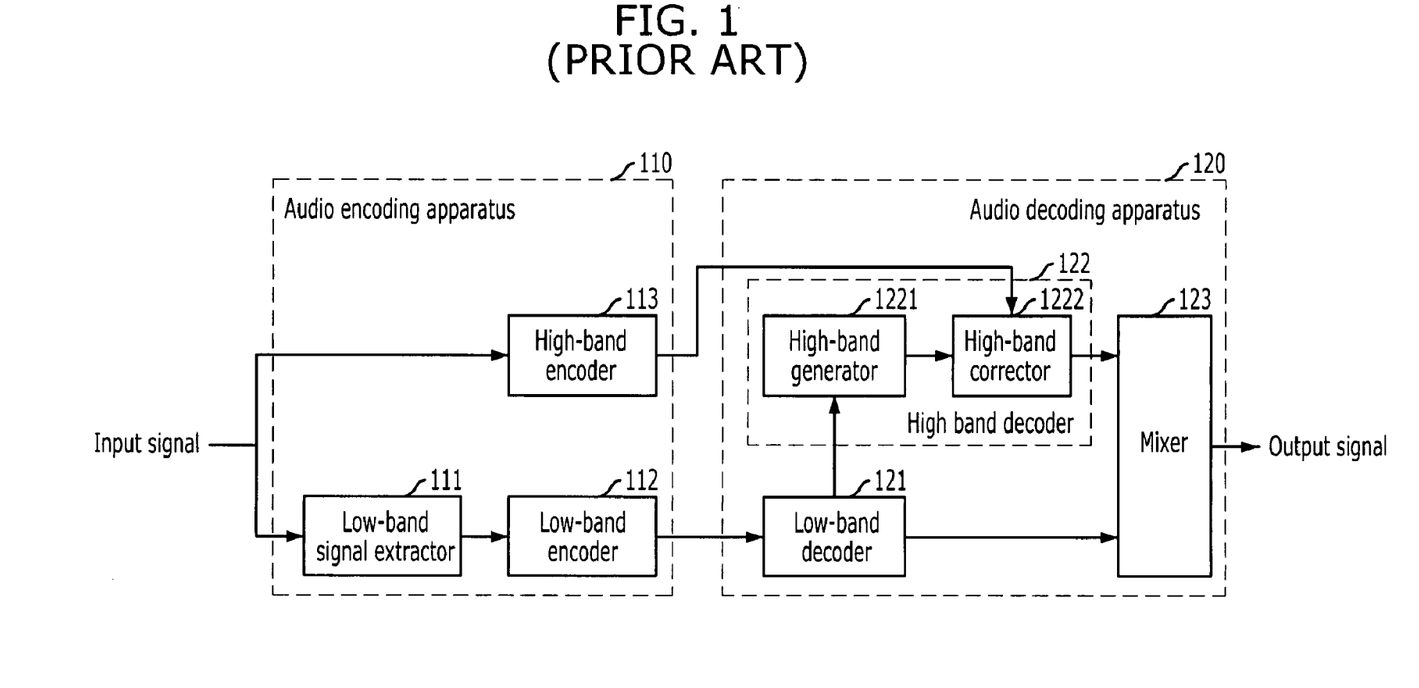
FIG. 1 is a diagram illustrating an audio encoding/decoding apparatus for bandwidth extension according to the prior art.

FIG. 1 is a diagram illustrating an audio encoding/decoding apparatus for bandwidth extension according to the prior art.

As shown in FIG. 1, the audio encoding apparatus 110 for bandwidth extension according to prior art includes a low-band signal extractor 111, a low-band encoder 112, and a high-band encoder 113. On the contrary, the audio decoding apparatus 120 for bandwidth extension according to the prior art includes a low-band decoder 121, a high-band decoder 122, and a mixer 123. The high-band decoder 122 includes a high-band generator 1221 and a high-band corrector 1222.

The audio decoding apparatus 110 for bandwidth extension according to the prior art compresses an input signal using a bandwidth extension technology.

To be specific, the low-band signal extractor 111 receives an input signal such as an audio signal and extracts a low-band signal using a low pass filter (LPF). For example, the low-band signal extractor 111 may be embodied using a low pass filter that passes a low-band signal such as 8 kHz. In this case, frequency bands lower than 8 kHz are defined as low-band, and frequency bands higher than 8 kHz are defined as high-band.

The low-band encoder 112 encodes the extracted low-band signal from the low-band signal extractor 111 based on a transform coding scheme. The transform coding scheme is a coding technology that codes data by transforming an input signal to a frequency domain and quantizing the transformed signal according to an acoustic significance of each frequency coefficient. For example, Moving Picture Experts Group MPEG-1 Layer 3 Audio Codec (MP3) and MPEG-2/4 Advanced Audio Coding (AAC) are representative Transform Coding technologies.

The audio encoding apparatus 110 does not employ a typical coding scheme that directly quantizes and transmits a high-band signal according to a transform coding scheme. Therefore, the high-band encoder 113 receives an input signal, which is an audio signal, extracts and quantizes correction parameters from the received input signal by comparing low-band frequency information and high-band frequency information thereof, and transmits the results to the audio decoding apparatus 120.

Meanwhile, the audio decoding apparatus 120 restores an original signal using the compressed signal and the correction parameters from the audio encoding apparatus 110.

To be specific, the low-band decoder 121 restores a low-band signal by decoding the transform-coded low-band signal from the audio encoding apparatus 110 according to a transform coding scheme.

The high-band decoder 122 copies necessary frequency information from the reconstructed low-band signal of the low-band decoder 121 and restores a high-band signal using the copied frequency information. The high-band decoder 122 receives the correction parameters matched with difference between the low-band frequency characteristic and the high-band frequency characteristic from the high-band encoder 113 and corrects the high-band signal based on the received correction parameters. The correction parameters are used to accurately restore the high-band signal.

In other words, the high-band generator 1221 copies necessary information from the reconstructed low-band signal of the low-band decoder 121 and generates the high-band signal using the copied information. The high-band corrector 1222 corrects the high-band signal from the high-band generator 1221 according to the correction parameters from the high-band encoder 113.

The mixer 123 mixes the reconstructed low-band signal from the low-band decoder 121 and the reconstructed high-band signal from the high-band decoder 122 and outputs the mixed signal as an output signal.

The representative correction parameters used for encoding and decoding audio signal for bandwidth extension are energy and tonality. Since the low-band signal and the high-band signal are not matched in frequency energy, the audio encoding apparatus 110 divides the high-band signal into a plurality of sub-band signals, quantizes each of energies of the sub-band signals, and transmits the quantized results. The audio decoding apparatus 120 controls the energy of each sub-band signal of the high-band signal based on the energy of each sub-band signal from the audio encoding apparatus 110.

In general, the high-band signal has weaker tonality than the low-band signal. Therefore, it is necessary for the audio decoder 120 to weaken the tonality by reducing tonal characteristics before generating the high-band signal using the low-band signal. In order to weaken the tonality, the audio decoding apparatus 120 properly adds a noise to each high-band frequency band. The audio encoding apparatus 110 calculates and quantizes a noise level of each band to correct the tonality of the high-band signal and transmits the results to the audio decoding apparatus 120.

As a well-known audio encoding/decoding technology using bandwidth extension, a spectral band replication (SBR) technology was introduced. The SBR technology is generally used in a MPEG-4 HE-AAC encoding apparatus.

According to the SBR technology, the high-band encoder 113 transforms an input signal to a plurality of time-frequency domain signals using a quadrature mirror filter (QMF). The high-band encoder 113 measures tonality of each frequency channel based on prediction capability of a time domain signal corresponding to each frequency channel and decides a noise level to add based on the measured tonality. The high-band encoder 113 uses a 2nd-order linear predictor for predicting a time domain signal.

According to the SBR technology of the prior art, a noise level is decided based on the fixed method without considering characteristics of an input signal. Therefore, it is impossible to accurately measure tonality in the SBR technology according to the prior art because the characteristics of an input signal are not considered.

Particularly, the SBR technology according to the prior art incorrectly decides a noise level to be higher than a necessary noise level to add when a pitch frequency of an input signal is low. If a high-band signal is reconstructed using the incorrect noise level which is higher than the necessary noise level to add, high-band performance is deteriorated due to excessively added noise. As a result, the quality of the reconstructed signal is deteriorated. Therefore, there is a demand to develop a method of accurately deciding a noise level in consideration of the characteristics of an input signal for improving the performance of the SBR technology and the overall performance of the audio encoding apparatus 120.

Figure 2:
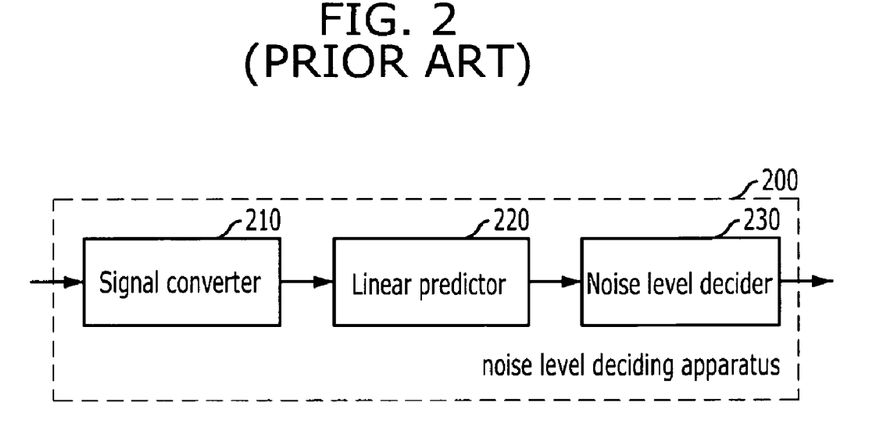
FIG. 2 is a diagram illustrating a noise level deciding apparatus employing a SBR technology according to the prior art.

FIG. 2 is a diagram illustrating a noise level deciding apparatus employing a SBR technology according to the prior art.

As shown in FIG. 2, the noise level deciding apparatus 200 according to the prior art includes a signal converter 210, a linear predictor 220, and a noise level decider 230.

The signal converter 210 converts an input signal to a 32×64 time-frequency domain. For example, if a sampling frequency of an input signal is 48 kHz, a bandwidth of each frequency channel is 375 Hz.

The linear predictor performs 2nd-order linear prediction on the converted input signal from the signal converter 210 independently for 64 frequency channels and measures tonality of each channel based on the result of the 2nd-order linear prediction.

The noise level decider 230 compares the measured tonalities of low-band channels and high-band channels and decides a noise level to add to high-band channel based on the comparison result. That is, the noise level is added to make a reconstructed high-band signal to have original tonality. Here, the noise level decider 230 may combine a plurality of frequency channels into a block by reducing a resolution of a frequency channel and may allocate a noise level to each block in order to reduce the number of parameters to transmit.

Eq. 1 is a method of deciding a noise level.

$$\text{noise level} = G \frac{1}{T[p]} \text{ or } K \frac{T[q]}{T^2[p]} \quad \text{Eq. 1}$$

In Eq. 1, T[p] denotes a tonality value for a frequency channel p. G and K are constants.

The high-band generator 1221 copies a frequency from a $q^{th}$ low-band channel and generates a frequency of a $p^{th}$ high-band channel. Here, a noise level to add to the $p^{th}$ channel is calculated using Eq. 1.

However, since a pitch frequency of an input signal is not considered, a measured tonality value of the noise level deciding apparatus 200 may be not identical to a real tonality value. Therefore, the noise level deciding apparatus 200 of FIG. 2 may incorrectly decide a noise level. For example, if the measured tonality value of the noise level deciding apparatus 200 is two times smaller than a real tonality value, the noise level deciding apparatus 200 decides a noise level to be two times greater than an ideal noise level for a real tonality value using Eq. 1. In this case, the performance of the audio encoding apparatus 110 is significantly deteriorated because too much high-band noise is added.

Figure 3:
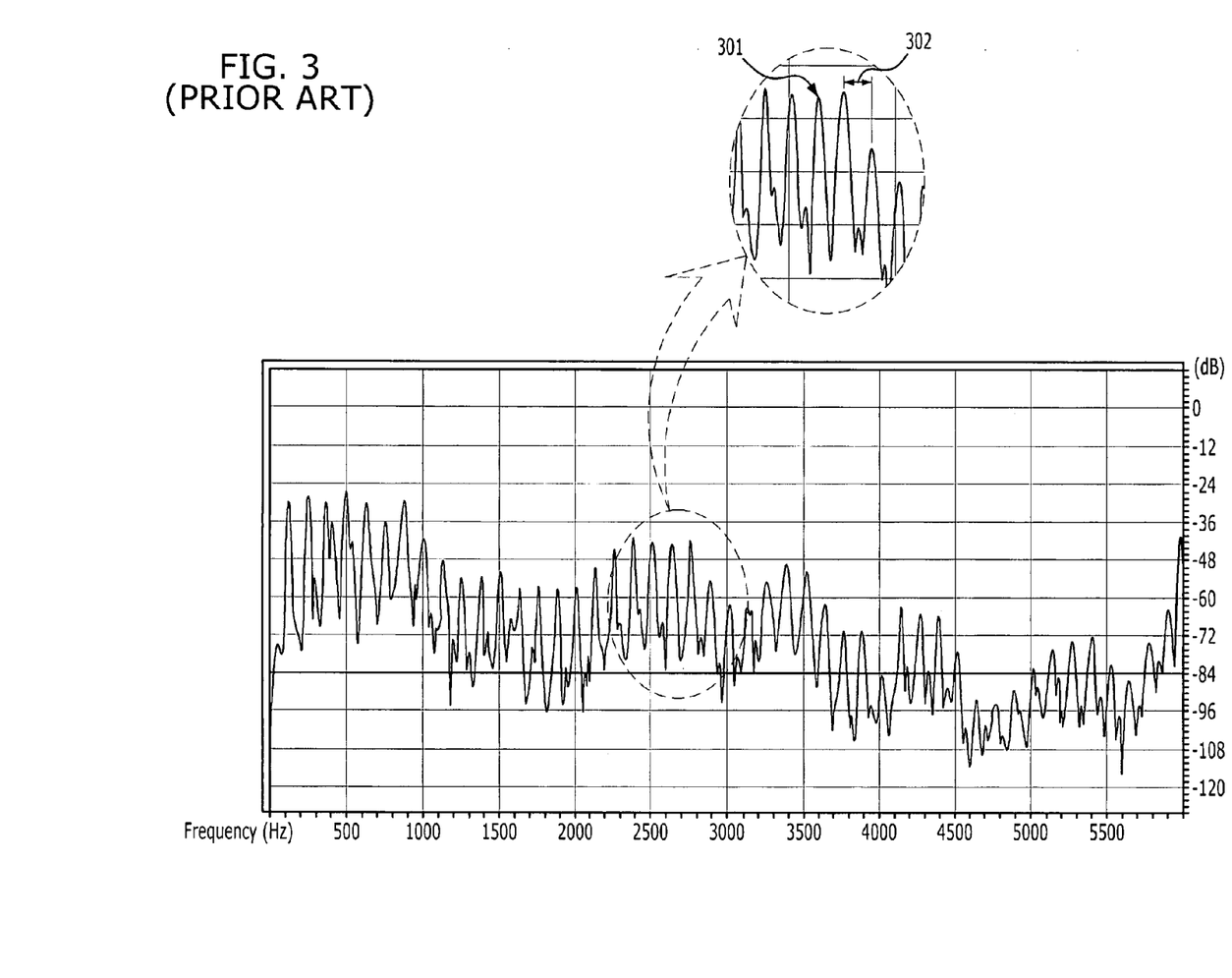
FIG. 3 is a graph showing spectrum representing harmonic components of an audio signal.

FIG. 3 is a graph showing spectrum representing harmonic components of an audio signal.

An audio signal having strong tonality includes a fundamental frequency and corresponding strong harmonic frequency components of the fundamental frequency. As shown in FIG. 3, the harmonic frequency components of the audio signal has a harmonic peak 301 at every peak interval 302 in a frequency domain. If a pitch frequency is small, the peak interval 302 is shortened.

In the SBR technology, a plurality of harmonic frequency components may be distributed in one frequency channel. Also, a frequency channel may include frequency components that are not related thereto due to the aliasing effect of QMF for time-frequency analysis.

If a frequency channel includes a plurality of harmonic frequency components as described above, it may deteriorate the prediction performance for measuring the tonality of each channel through 2nd-order linear prediction. The linear predictor 220 may incorrectly predict that an input signal has tonality lower than normal tonality. Therefore, a measured tonality value of input signal, which has strong tonality, may be smaller than a real tonality value according to relation of an input pitch frequency and a frequency channel configuration. In this case, the noise level decider 230 decides a noise level greater than a normal noise level and the SBR performance and the overall performance of the audio encoding apparatus 110 are deteriorated.

FIGS. 4A to 4D are graphs for describing harmonic components of a frequency channel which vary according to a pitch frequency and the corresponding tonality difference due to those harmonic components.

Figure 4A:
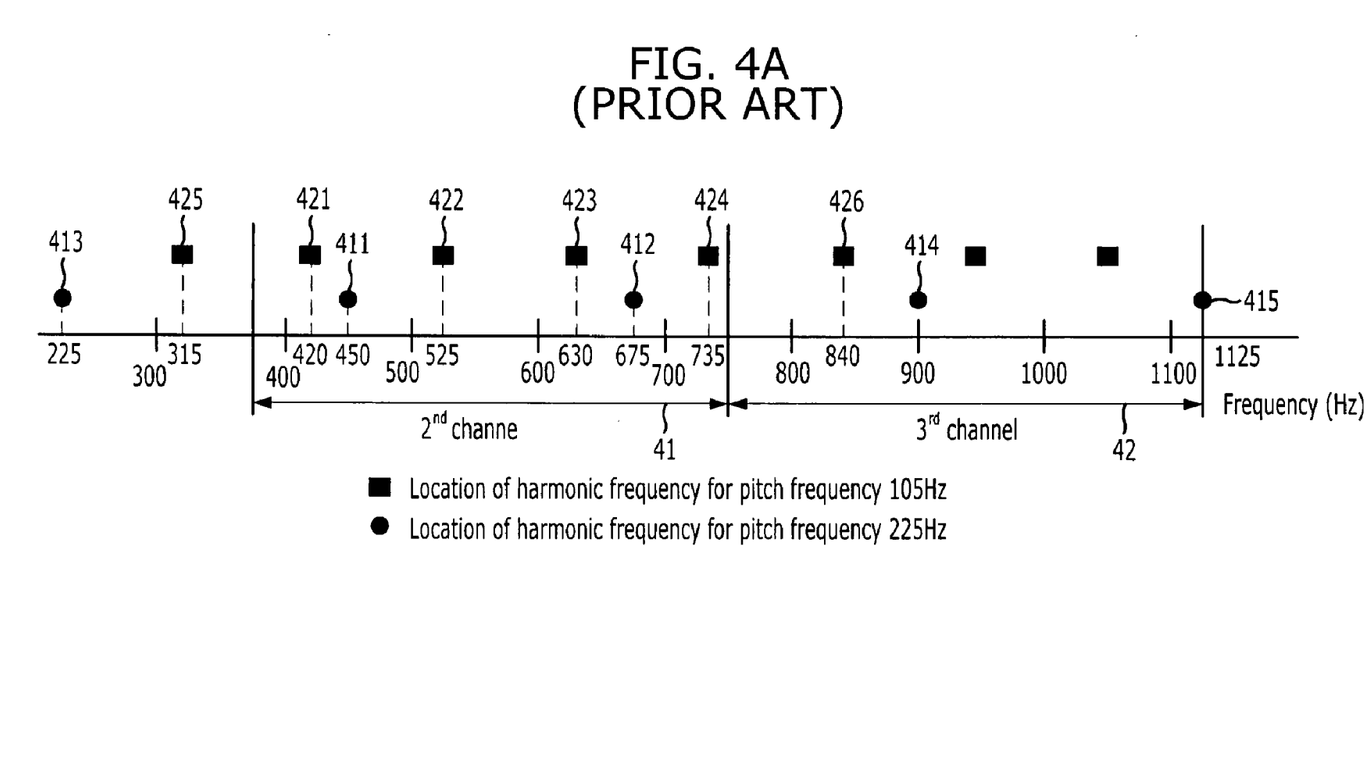
FIGS. 4A to 4D are graphs showing harmonic components of a frequency channel varying according to a pitch frequency and the corresponding tonality difference due to those harmonic components.

As shown in FIG. 4A, a symbol ■ denotes harmonic frequency locations 421 to 426 for a pitch frequency 105 Hz and a symbol ● denotes harmonic frequency locations 411 to 415 for a pitch frequency 225 Hz. The harmonic frequency locations for pitch frequencies 105 Hz and 225 Hz in second and third frequency channels 41 and 42 will be described. Here, a sampling frequency is 48 kHz and a bandwidth of a channel is 375 Hz.

Figure 4B:
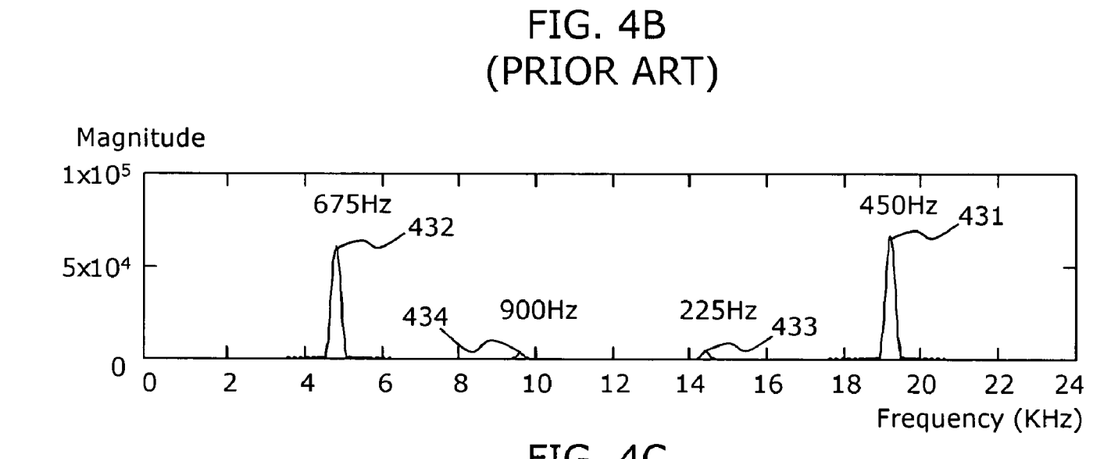
Figure 4C:
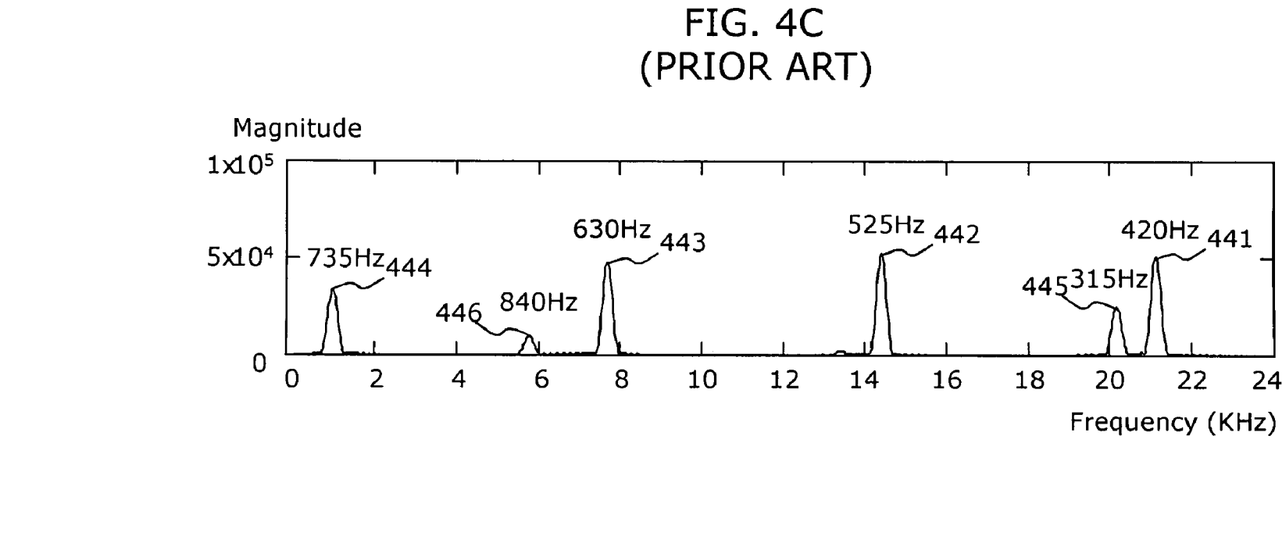
Figure 4D:
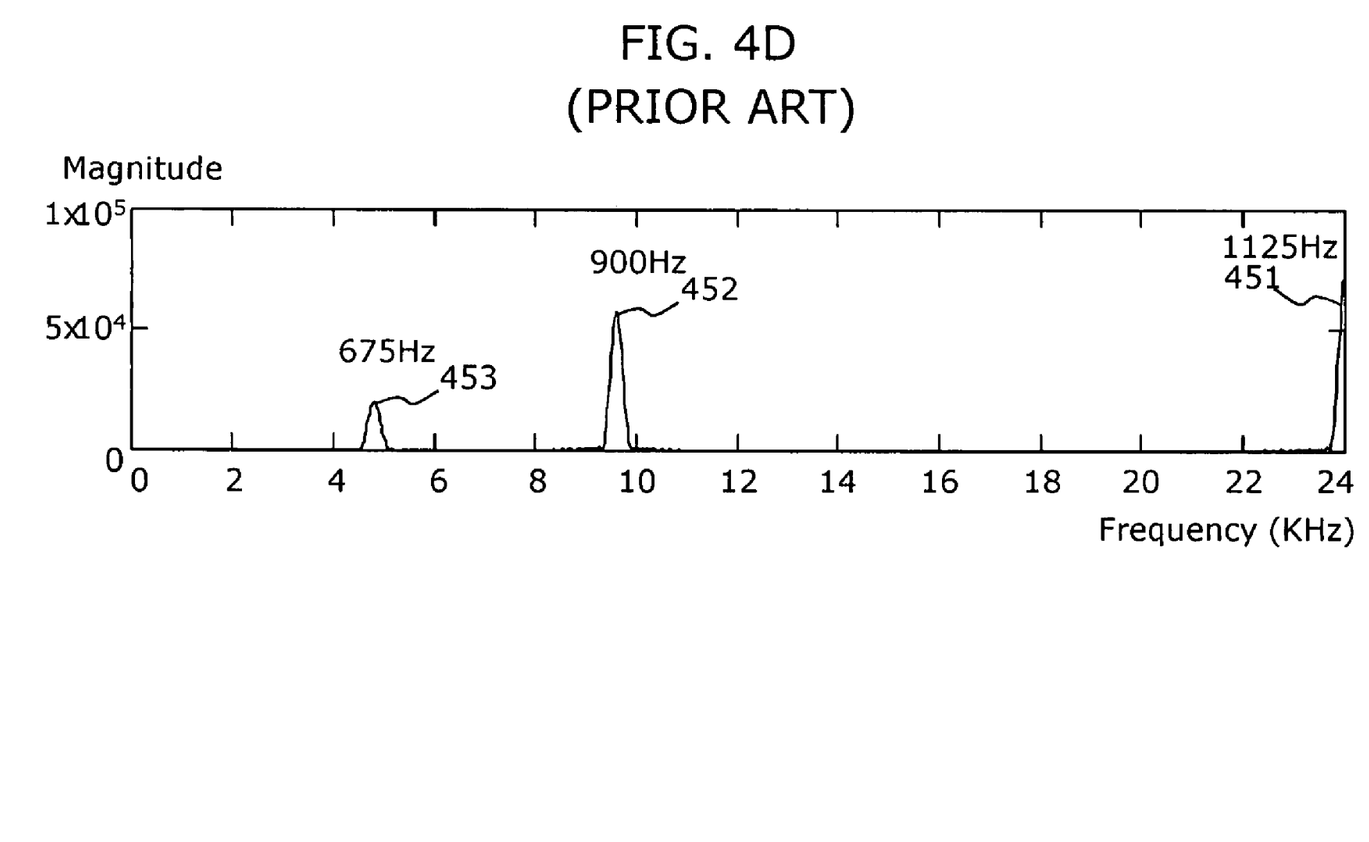

FIGS. 4B to 4D show spectrum of the second and third frequency channels for each pitch frequency.

FIG. 4B shows spectrum and each harmonic component of the second channel 41 for a signal having a pitch frequency of 225 Hz. The second channel corresponds to frequencies from 375 Hz to 750 Hz. For a signal having a pitch frequency of 225 Hz, a harmonic component 411 having 450 Hz, which is located inside the second channel 41, corresponds to a second peak 431 in spectrum, and the harmonic component 412 having 675 Hz, which is also located inside the second channel 41, corresponds to a first peak 432. As shown, the order of harmonic location is reversed due to frequency folding caused by 64 times down-sampling. Although harmonic components 414 and 413 are not located inside the second channel 41, corresponding small two peaks 434 and 433 of 900 Hz and 225 Hz are included inside the second channel signal due to aliasing. A corresponding second channel signal with a pitch frequency of 225 Hz can be accurately predicted using a 2nd-order predictor, and the tonality is measured as about 40.

FIG. 4C shows spectrum and harmonic components of the second channel 41 (375 Hz to 750 Hz) for a signal having a pitch frequency of 105 Hz. For a signal having a pitch frequency of 105 Hz, harmonic components 421, 422, 423, and 424 having 420 Hz, 525 Hz, 630 Hz, and 735 Hz, which are all located inside the second channel 41, correspond to a fourth peak 441, a third peak 442, a second peak 443, and a first peak 444, respectively, in spectrum. A corresponding second channel includes two aliasing harmonic peaks 445 and 446 of 315 Hz and 840 Hz in addition to four normal harmonic peaks 441 to 444. Therefore, the 2nd-order predictor cannot normally perform prediction for a corresponding second channel signal with a pitch frequency of 105 Hz and incorrectly measures tonality about 1.0.

FIG. 4D shows spectrum and harmonic components of the third channel 42 (750 Hz to 1125 Hz) for a signal having a pitch frequency of 225 Hz. For a signal having a pitch frequency of 225 Hz, the harmonic components 414 and 415 having 900 Hz and 1125 Hz, which are located inside the third channel 42, correspond to a second peak 451 and a first peak 452 respectively, in spectrum. A corresponding third channel includes two normal harmonic peaks 451 and 452 and one aliasing peak 453. In comparison with FIG. 4B, a size of the aliasing harmonic peak 453 of 675 Hz is large although the number of harmonic peaks decreases. Thus, tonality is measured about 1.0 smaller than real tonality. That is, since a harmonic component of 675 Hz outside the corresponding third channel is close to a channel boundary, the aliasing effect is occurred greatly in the third channel.

As shown in FIGS. 4A to 4D, tonality is inconstantly measured according to a pitch frequency and a relative location between harmonic components and channel boundary. It is impossible to prevent the aliasing. However, when a pitch frequency is large, the aliasing is occurred only in some channels according to a relative location between a harmonic frequency and a channel boundary.

In order to overcome an aliasing problem, the noise level deciding apparatus 200 of FIG. 2 may calculate an averaged tonality for a plurality of channels by reducing a channel resolution. In this case, it is possible to slightly correct incorrectly measured tonality that is smaller than real tonality, especially for a large pitch frequency.

However, if a pitch frequency is small, the number of normal harmonic components included in one channel increases. It commonly happens in all channels. Therefore, the effect of the increased number of normal harmonic components in one channel is not reduced by reducing a channel resolution. Also, a noise level further increases when a pitch frequency is small because channel aliasing occurs more if the pitch frequency is small.

As described above, the accuracy of deciding a noise level varies according to a pitch frequency. Therefore, it is necessary to correct a noise level of each channel by calculating a boundary of each frequency channel according to a sampling frequency and analyzing correlation between the location of harmonic component and the calculated boundary.

SUMMARY OF THE INVENTION

An embodiment of the present invention is directed to providing an apparatus and method of adaptively deciding a noise level for bandwidth extension, which accurately measure a high-band noise level and improve the quality of a high-band signal by adaptively controlling a high-band noise level according to a pitch frequency of an input signal in deciding a high-band noise level to correct tonality of a high-band signal.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an aspect of the present invention, there is provided an apparatus of determining an adaptive noise level, including a noise level decider for deciding a high-band noise level for bandwidth extension according to tonality of an input signal, a pitch frequency analyzer for detecting a pitch frequency of the input signal and analyzing correlation between the detected pitch frequency and a frequency channel, and a noise level controller for adaptively controlling the decided high-band noise level based on the analyzed correlation of the pitch frequency and the frequency channel.

In accordance with another aspect of the present invention, there is provided a method of determining an adaptive noise level, including deciding a high-band noise level for bandwidth extension according to tonality of an input signal, detecting a pitch frequency of the input signal and analyzing correlation between the detected pitch frequency and a frequency channel, and adaptively controlling the decided high-band noise level based on the analyzed correlation of the pitch frequency and the frequency channel.

DESCRIPTION OF SPECIFIC EMBODIMENTS

The advantages, features and aspects of the invention will become apparent from the following description of the embodiments with reference to the accompanying drawings, which is set forth hereinafter.

Figure 5:
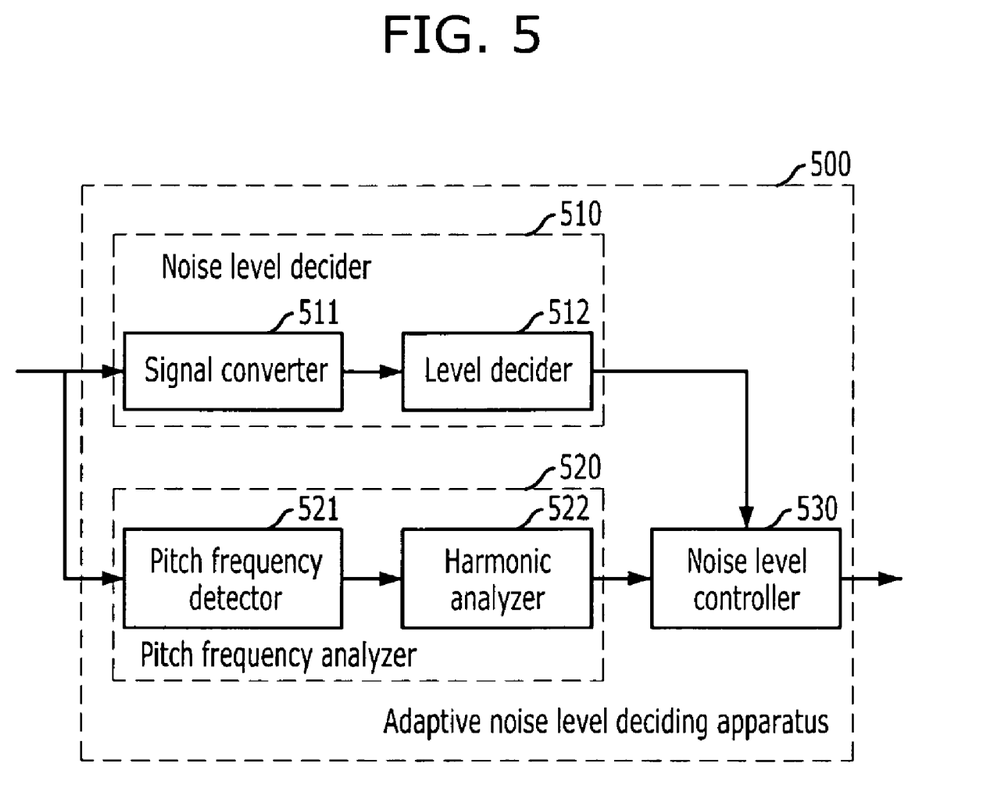
FIG. 5 is an apparatus of deciding an adaptive noise level in accordance with an embodiment of the present invention.

Although an apparatus 500 of deciding an adaptive noise level according to an embodiment of the present invention will be described to use a bandwidth extension method and to receive a signal having a sampling frequency of 48 kHz, the present invention is identically applied to other sampling frequencies.

FIG. 5 is an apparatus of deciding an adaptive noise level in accordance with an embodiment of the present invention.

As shown in FIG. 5, the adaptive noise level deciding apparatus 500 according to the present embodiment includes a noise level decider 510, a pitch frequency analyzer 520, and a noise level controller 530. The noise level decider 510 includes a signal converter 511 and a level decider 512. The pitch frequency analyzer 520 includes a pitch frequency detector 521 and a harmonic analyzer 522.

Hereinafter, the constituent elements of the adaptive noise level deciding apparatus 500 will be described.

The noise level decider 510 converts an input signal to a frequency domain signal and measures tonalities of each frequency channel in the converted input signal. The noise level decider 510 decides a high-band noise level for a band formed of a plurality of frequency channels or each frequency channel according to the measured tonality of each frequency channel.

In more detail, when the apparatus 500 receives an input signal x[n] where n=0, . . . , 1023, the signal converter 511 converts the input signal x[n] to a frequency domain x[j][k] where j=0, . . . , 31, k=0, . . . , 63. Herein, j denotes a time index and k denotes a frequency channel.

The level decider 512 measures a tonality value T[i] which represents tonality of each frequency channel according to 2nd-order prediction performance. Here, the level decider 512 may calculates tonality values $T_0[i]$ and $T_1[j]$ after dividing the time index into two time regions j=0, . . . , 15, and j=16, . . . , 31.

The level decider 512 decides a high-band noise level for a band of each frequency channel or a band formed of a plurality of frequency channels based on the measured tonality value T[i] using Eq. 1.

The pitch frequency analyzer 520 detects a pitch frequency of the input signal and analyzes correlation between the detected pitch frequency and the frequency channel.

Such operation of the pitch frequency analyzer 520 will be described in more detail, hereinafter. At first, the pitch frequency detector 521 detects a pitch frequency of an input signal. The pitch frequency detector 521 may use a well-known pitch frequency search method. For example, the pitch frequency detector 521 calculates a correlation coefficient of an input signal.

The pitch frequency detector 521 compares the calculated correlation coefficient with a reference value such as 0.75. If the calculated correlation coefficient is higher than the reference value and if the energy of the input signal is greater than reference energy, a current frame is decided as a harmonic frame. The pitch frequency detector 521 calculates a pitch frequency of a current frame by checking relation between the calculated pitch frequency with a pitch frequency of a previous frame.

If the current frame is not determined as a harmonic frame, the pitch frequency detector 521 outputs related information. For example, the pitch frequency detector 521 may output "0" as a pitch frequency detection value. If the pitch frequency detection value is "0", the harmonic analyzer 522 and the noise level controller 530 decides the decided noise level from the level decider 512 as a final noise level without performing any operation.

The harmonic analyzer 522 analyzes correlation and related harmonic frequency components using the detected pitch frequency from the pitch frequency detector 521 and frequency channel characteristics. That is, the harmonic analyzer 522 analyzes a channel bandwidth decided by encoder specification, channel boundary, and locations of harmonic components decided by the detected pitch frequency. Then, the harmonic analyzer 522 transfers the analysis result to the noise level controller 530.

The noise level controller 530 adaptively control the decided high-band noise level from the level decider 512 based on the analysis result from the harmonic analyzer 522. That is, the noise level controller 530 output a new noise level by controlling the decided noise level from the noise level decider 512. That is, the decided noise level from the level decider 512 is controlled adaptively according to a pitch frequency in order to improve encoding performance.

Hereinafter, such operation of the noise level controller 530 will be described in more detail. At first, the noise level controller 530 multiplies a predetermined gain to an input noise level. That is, the noise level controller 530 calculates a noise level gain value according to the analyzed harmonic frequency components and adaptively controls the high-band noise level using the calculated noise level gain value.

If it is determined that each frequency channel include more than three strong harmonic components, the noise level controller 530 reduces the output of the level decider 512 by decreasing the gain value to be smaller than '1'. On the contrary, if it is determined that each frequency channel includes less than two strong harmonic components, the noise level controller 530 outputs a high-band noise level, which is the output of the level decider 512, without controlling it by controlling the gain value to be equal to '1'.

The noise level controller 530 determines the number of harmonic components when a plurality of harmonic components are included in a channel because a pitch frequency is smaller than a channel bandwidth and even when harmonic components outside the corresponding channel are included due to aliasing because harmonic components outside the channel are close to a channel boundary. A magnitude of each harmonic component is decided according to a distance to a boundary of a corresponding channel. A magnitude of a normal harmonic component increases as the normal harmonic component become more distant from a boundary and a magnitude of harmonic component included due to aliasing increases as harmonic component become closer to a boundary.

The level decider 512 combines a plurality of channels into a sub-band, not by each channel, and decides one noise level for each sub-band by reducing a resolution. In this case, the noise level of a corresponding sub-band may be equivalent to an average of noise levels of all channels included in the sub-band. Accordingly, the effect aliasing generated at a band boundary may be reduced. That is, if a pitch frequency is large, aliasing occurs only at a channel with harmonic components outside the channel close to the channel boundary, not all channels. Therefore, the aliasing problem may be reduced using an average noise level of a plurality of channels.

However, the aliasing problem occurs at all channels if a plurality of harmonic components are included in a channel because a pitch frequency is smaller than a channel bandwidth. In this case, the aliasing problem is not reduced additionally although the average noise level is used. Therefore, the noise level controller 530 reduces a high-band noise level when a pitch frequency is small.

The noise level controller 530 calculates optimum gains through training for various pitch frequencies and channel bandwidths and stores the calculated optimum gains in a table. The noise level controller 530 may control a noise level using the table. The noise level controller 530 may simply decide gain by setting a predetermined gain value only if a pitch frequency is small.

For example, the noise level controller 530 may calculate gain values according to Table 1.

TABLE 1 if pitch_freq < 125, then Gain = 100.0
else if pitch_freq < 200, then Gain = 100.0 + (pitch_freq − 125.0)/0.75 + 1.0
else Gain = 1.0

As shown in Table 1, the noise controller 530 sets a gain value as 100 if a pitch frequency is smaller than 125 Hz. The noise controller 530 decides gain using Table 1 when the pitch frequency is larger than 125 Hz and smaller than 200 Hz. Otherwise, the noise level controller 530 decides a gain value as 1.

Figure 6:
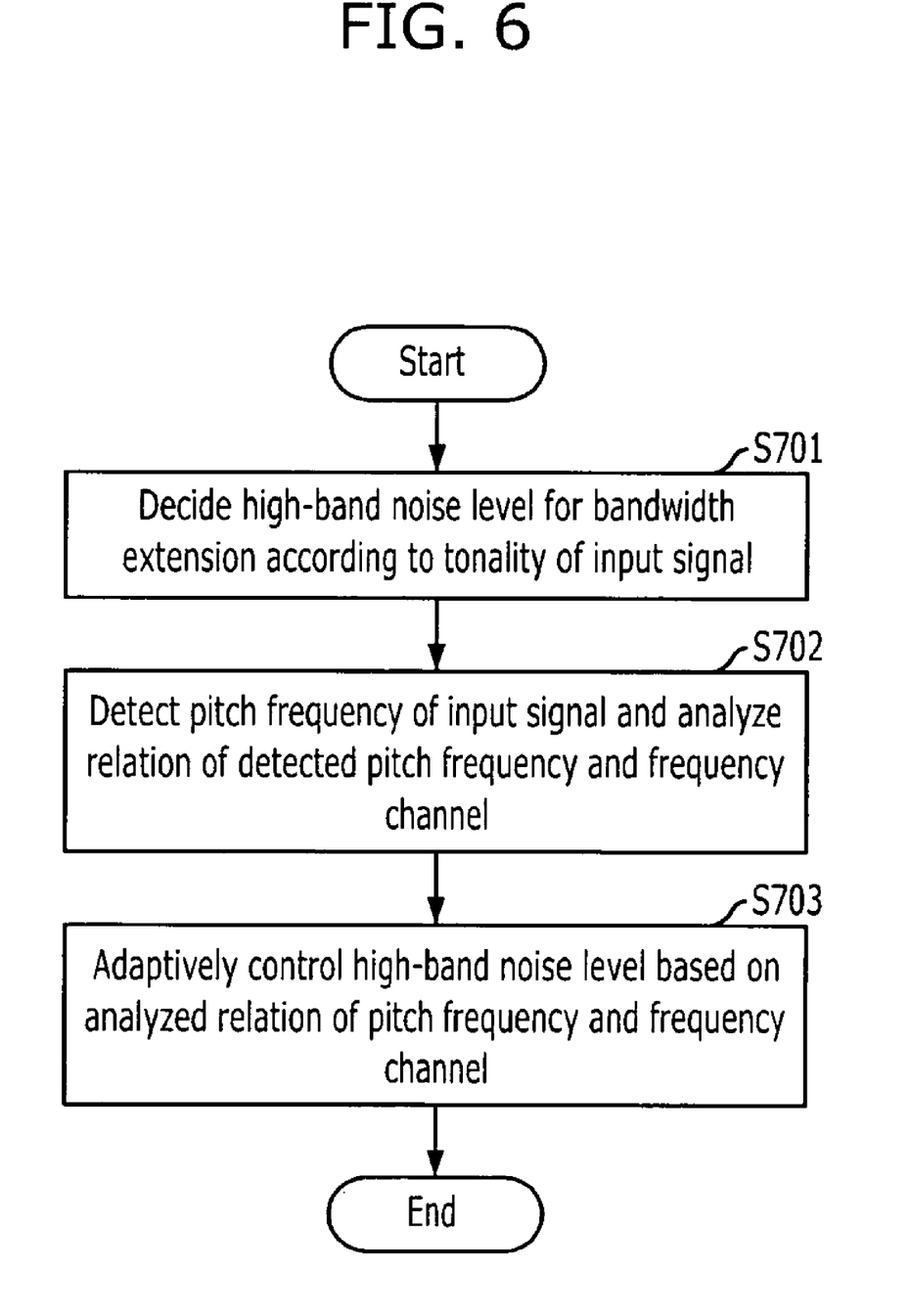
FIG. 6 is a flowchart describing a method of deciding an adaptive noise level for bandwidth extension in accordance with an embodiment of the present invention.

FIG. 6 is a flowchart describing a method of determining an adaptive noise level for frequency extension in accordance with an embodiment of the present invention. Since the operation of the apparatus of determining an adaptive noise level according to an embodiment of the present invention was described in detail hereinbefore, the method according to the present embodiment will be described briefly.

At first, the noise level decider 510 decides a high-band noise level for bandwidth extension according to tonality of an input signal at step S701.

The pitch frequency analyzer 520 detects a pitch frequency of the input signal and analyzes correlation between the detected pitch frequency and a frequency channel at step S702.

Then, the noise level controller 530 adaptively controls the decided high-band noise level based on the analyzed correlation of the pitch frequency and the frequency channel at step S703.

As described above, an apparatus and method of deciding an adaptive noise level according to the present invention can accurately measure a high-band noise level and improve quality of a high-band signal by adaptively controlling a high-band noise level according to a pitch frequency of an input signal in deciding a high-band noise level for correcting tonality of a high-band signal necessary for bandwidth extension.

For example, the apparatus and method of deciding an adaptive noise level according to the present invention can improve the overall performance of an audio encoder even using the same number of bits by improving quality of encoding a high-band signal in an audio encoding apparatus employing a high-band extension technology. Particularly, it is possible to improve overall performance of an audio encoding apparatus by only modifying a method of deciding a noise level because a high-band noise level is accurately decided according to a pitch frequency without changing a bit sequence structure or a protocol thereof of an audio encoding apparatus according to the prior art.

The above described method according to the present invention can be embodied as a program and stored on a computer readable recording medium. The computer readable recording medium is any data storage device that can store data which can be thereafter read by the computer system. The computer readable recording medium includes a read-only memory (ROM), a random-access memory (RAM), a CD-ROM, a floppy disk, a hard disk and an optical magnetic disk.

While the present invention has been described with respect to the specific embodiments, it will be apparent to those skilled in the art that various changes and modifications may be made without departing from the spirit and scope of the invention as defined in the following claims.

What is claimed is:

1. An apparatus of determining an adaptive noise level, comprising:
    a noise level decider for deciding a high-band noise level for bandwidth extension according to tonality of an input signal;
    a pitch frequency analyzer for detecting a pitch frequency of the input signal and analyzing correlation between the detected pitch frequency and a frequency channel;
    a noise level controller for adaptively controlling the decided high-band noise level based on the analyzed correlation of the pitch frequency and the frequency channel; and
    a harmonic analyzer for determining a number of harmonic frequency components and analyzing characteristics of the harmonic frequency components related to the correlation using the detected pitch frequency and frequency channel characteristics,
    wherein the noise level controller decreases the decided high-band noise level if the number of analyzed harmonic frequency components inside each frequency channel is larger than a predetermined threshold value.

2. The apparatus of claim 1, wherein the harmonic analyzer analyzes a harmonic frequency location of the detected pitch frequency, a harmonic peak magnitude, a bandwidth of a frequency channel, and a comparative relation of a harmonic frequency location based on a frequency channel boundary.

3. The apparatus of claim 1, wherein the noise level controller calculates a noise level gain value according to the analyzed harmonic frequency components and adaptively controls the decided high-band noise level using the calculated noise level gain value.

4. The apparatus of claim 3, wherein the noise level controller adaptively controls the decided high-band noise level according to noise level gain values that are previously calculated for each pitch frequency and channel bandwidth.

5. The apparatus of claim 4, wherein the noise level controller determines that the number of harmonic frequency components inside each frequency channel is larger than the predetermined threshold value if a plurality of harmonic frequencies are included in each frequency channel because the detected pitch frequency is smaller than a bandwidth of each frequency channel.

6. The apparatus of claim 4, wherein the noise level controller determines that the number of harmonic frequency components inside each frequency channel is larger than the predetermined threshold value if a plurality of large aliasing components are included in each frequency channel because aliasing is occurred by adjacent harmonic frequency components outside a frequency channel.

7. The apparatus of claim 4, wherein the noise level controller does not control the decided high-band noise level if the number of analyzed harmonic frequency components included in each frequency channel is less than the predetermined threshold value.

8. A method of determining an adaptive noise level, comprising:
    deciding a high-band noise level for bandwidth extension according to tonality of an input signal;
    detecting a pitch frequency of the input signal and analyzing correlation between the detected pitch frequency and a frequency channel;
    adaptively controlling the decided high-band noise level based on the analyzed correlation of the pitch frequency and the frequency channel; and
    determining a number of harmonic frequency components and analyzing characteristics of the harmonic frequency components related to the correlation using the detected pitch frequency and frequency channel characteristics,
    wherein the decided high-band noise level is decreased when the number of analyzed harmonic frequency components included in each frequency channel is larger than a predetermined threshold value.

9. The method of claim 8, wherein in said adaptively controlling the decided high-band noise level,
    a noise level gain value is calculated according to the analyzed harmonic frequency components and the decided high-band noise level is adaptively controlled using the calculated noise level gain value.

10. The method of claim 9, wherein in said adaptively controlling the decided high-band noise level, the decided high-band noise level is adaptively controlled according to noise level gain values that are previously calculated for each pitch frequency and channel bandwidth.

11. The method of claim 10, wherein in said adaptively controlling the decided high-band noise level, the number of harmonic frequency components larger than the predetermined threshold value are determined to be included in each frequency channel when a plurality of harmonic frequencies are included in each frequency channel because the detected pitch frequency is smaller than a bandwidth of each frequency channel.

12. The method of claim 10, wherein in said adaptively controlling the decided high-band noise level, the number of harmonic frequency components larger than the predetermined threshold value are determined to be included in each frequency channel when a plurality of large aliasing components are included in each frequency channel because aliasing occurs by adjacent harmonic frequency components outside a frequency channel.

13. The method of claim 10, wherein in said adaptively controlling the decided high-band noise level, the decided high-band noise level is not controlled when the analyzed harmonic frequency components are included in each frequency channel less than the predetermined threshold value.

* * * * *